(12) United States Patent
Heston et al.

(10) Patent No.: US 7,884,442 B2
(45) Date of Patent: Feb. 8, 2011

(54) INTEGRATED CIRCUIT RESISTOR

(75) Inventors: David D. Heston, Dallas, TX (US); Jon E. Mooney, Dallas, TX (US)

(73) Assignee: Raytheon Company, Waltham, MA (US)

( * ) Notice: Subject to any disclaimer, the term of this patent is extended or adjusted under 35 U.S.C. 154(b) by 210 days.

(21) Appl. No.: 11/678,732

(22) Filed: Feb. 26, 2007

(65) Prior Publication Data

US 2007/0138646 A1   Jun. 21, 2007

Related U.S. Application Data

(62) Division of application No. 10/917,935, filed on Aug. 13, 2004, now Pat. No. 7,199,016.

(51) Int. Cl.
*H01L 29/00* (2006.01)

(52) U.S. Cl. ......... 257/528; 257/533; 257/534; 257/536; 257/537; 257/538; 257/541; 257/489; 257/516; 257/350; 257/351; 257/622; 257/379; 257/380; 257/E27.012

(58) Field of Classification Search ......... 257/533–534, 257/536–538, 541, 489, 516, 350–351, 528, 257/622, 379–380, E27.012
See application file for complete search history.

(56) References Cited

U.S. PATENT DOCUMENTS

| 4,701,241 | A | 10/1987 | Schlesier | 156/643 |
| 5,141,597 | A | 8/1992 | Adams et al. | 156/628 |
| 6,245,628 | B1 | 6/2001 | Fukui et al. | 438/385 |
| 6,307,221 | B1 * | 10/2001 | Danzilio | 257/192 |
| 2004/0080396 | A1 | 4/2004 | Frank | 338/100 |
| 2004/0164317 | A1 | 8/2004 | Nishihori et al. | 257/183 |
| 2005/0127400 | A1 | 6/2005 | Yeo et al. | 257/194 |
| 2005/0184310 | A1 | 8/2005 | Krutko et al. | 257/197 |
| 2005/0263822 | A1 | 12/2005 | Asano | 257/357 |

FOREIGN PATENT DOCUMENTS

| CN | 1116701 C | 7/2003 |
| CN | 1722435 A | 1/2006 |
| EP | 0 256 568 A2 | 6/1987 |
| JP | 59214250 | 12/1984 |
| JP | 10012630 | 1/1998 |

(Continued)

OTHER PUBLICATIONS

Mellen, N., *Reduced Variation GaAS MESFETS through the Use of an On-Chip Resistor*, Motorola Technical Developments, Motorola Inc., Schaumburg, IL, USA, vol, 18, pp. 22-24, Mar. 1, 1993.

(Continued)

*Primary Examiner*—Lynne A Gurley
*Assistant Examiner*—Samuel A Gebremariam
(74) *Attorney, Agent, or Firm*—Baker Botts L.L.P.

(57) ABSTRACT

An integrated circuit resistor is provided that comprises a mesa 14 between electrical contacts 16 and 18. The electrical resistance between electrical contacts 16 and 18 is selectively increased through the formation of recesses 20 and 22 in the mesa 14. The size of recesses 20 and 22 can be used to tune the value of the electrical resistance between contacts 16 and 18.

5 Claims, 2 Drawing Sheets

FOREIGN PATENT DOCUMENTS

| | | |
|---|---|---|
| JP | 2001015767 | 1/2001 |
| JP | 2003060044 | 2/2003 |
| JP | 2004193273 | 7/2004 |
| WO | WO 01/61733 A2 | 2/2001 |

OTHER PUBLICATIONS

PCT Notification of Transmittal of the International Search Report and the Written Opinion of the International Searching Authority, or the Declaration, mailed Jan. 24, 2006 for PCT/US05/028776 (14 pgs.), Jan. 12, 2006.

State Intellectual Property Office of the People's Republic of China; The First Office Action (PCT application in Chinese national phase); Filing # 200580027497.5; Applicant: Raytheon Company; Date of Issue: 7 pages, Jun. 6, 2008.

European Patent Office, Communication Pursuant to Article 94(3) EPC, Application No. 05 789 167.3-1235, 6 pages, Mar. 25, 2009.

* cited by examiner

INTEGRATED CIRCUIT RESISTOR

RELATED APPLICATIONS

This application is a divisional of application Ser. No. 10/917,935 filed Aug. 13, 2004, entitled Integrated Circuit Resistor.

TECHNICAL FIELD OF THE INVENTION

This invention relates in general to the field of electronic devices and more particularly, to an improved integrated circuit resistor and method for forming the same.

BACKGROUND OF THE INVENTION

In order to form the complex systems required to meet today's integrated electronics market, integrated circuits must contain a variety of active and passive elements all formed on a common substrate. For some applications, resistors having relatively large resistance values have become a limiting factor in the attempts to reduce the overall size of the integrated devices.

Typical techniques to construct resistors and integrated circuits involve the deposition or growth of semiconductive films on the outer surfaces of the semiconductor substrate or outer layers. Contact points are then made to the films and the area of the film and the spacing of the contacts are used to adjust the resistance value of the resistor. These techniques can effectively be used to create resistors having relatively low resistance values on the order of several ohms up to several hundred ohms in value. However, if a particular electronic circuit requires a resistor having a resistance of many thousands of ohms, these techniques will require the dedication of large portions of the substrate area to the formation of these resistors.

SUMMARY OF THE INVENTION

Accordingly, a new approach to integrated circuit resistor construction is provided that substantially eliminates or reduces problems and disadvantages associated with prior methods and structures.

In accordance with one embodiment of the present invention, a device is formed outwardly from the surface of a semiconductor substrate. Semiconductor layer is formed on an outer surface of the semiconductor substrate. First and second contacts are made to the semiconductor layer spaced apart a predetermined distance. A portion of the semiconductor layer is removed from the outer surface of the semiconductor layer to form a recess between the spaced apart first and second contacts such that the electronic resistance between the first and second contacts through the semiconductor layer is increased a predetermined amount.

According to one particular embodiment of the present invention, the semiconductor layer comprises a plurality of layers that include etch stop layers to enable the removal of portions of the epitaxial layer.

According to still another embodiment of the present invention, the removal of portions of the semiconductor layer to increase the resistance of the resistance between the first and second contact points is accomplished in at least two etching steps to create at least two recesses in the epitaxial layer between the first and second contacts. In this manner, the size of the first and second recesses can be adjusted to enable very accurate tuning of the value of the resistance between the first and second contact points.

BRIEF DESCRIPTION OF THE DRAWINGS

A more complete understanding of the present invention and the advantages thereof may be acquired by referring to the accompanying figures in which like reference numbers indicate like features and wherein.

DETAILED DESCRIPTION OF THE INVENTION

Figure 1A:
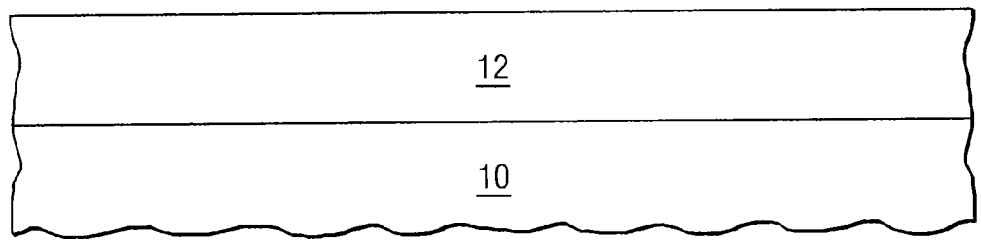
FIGS. 1A through 1E are a series of sequential, greatly enlarged, cross-sectional elevational diagrams illustrating the method of forming an integrated circuit resistor according to one embodiment of the present invention.

Referring to FIG. 1A, a semiconductor substrate 10 is illustrated. Substrate 10 may comprise silicon, germanium, gallium arsenide, silicon germanium, indium phosphide, gallium nitride, indium gallium phosphide, silicon carbide, or other suitable material. An epitaxial layer 12 of semiconductor material is formed using conventional epitaxial techniques on the outer surface of substrate 10. Epitaxial layer 12 may comprise any number of sequentially formed layers comprising different materials. As will be discussed herein, epitaxial layer 12 may comprise interstitial etch stop layers that may be used in later etching processes to provide etch depths that can be very accurately controlled. For example, one possible sequence of forming epitaxial layer 12 comprises the formation first of a super-lattice buffer layer comprising the alternating sequence of 15 Angstrom gallium arsenide layers with 200 Angstrom aluminum gallium arsenide layers. These alternating sequences can be done ten times to result in a super-lattice buffer layer approximately 2,150 Angstroms in thickness. The outer surface of the super-lattice buffer layer may then be subjected to a suitable bottom silicon pulse doping.

An Aluminum gallium arsenide spacer layer approximately 50 Angstroms in thickness can then be formed. Next, an indium gallium arsenide channel layer, approximately 135 Angstroms in thickness can be formed. Subsequently, an additional 30 Angstrom spacer layer of aluminum gallium arsenide can be formed followed by a second silicon pulse doping step. Next, a 500 Angstrom layer of aluminum gallium arsenide is epitaxially grown with N-type ions at a concentration of $3E17$ $cm^{-3}$. Next, a 150 Angstrom layer of gallium arsenide can be formed with N-type doping to the same concentration of $3E17$ $cm^{-3}$. Next, an aluminum arsenide etch stop layer is formed to a thickness on the order of 10 to 20 Angstroms and is doped with N-type ions at a concentration of $1.2E18$ $cm^{-3}$. The aluminum arsenide etch stop layer will act as an etch stop for later etching steps into the epitaxial layer 12. The epitaxial layer 12 may be completed by the formation of a gallium arsenide layer approximately 150 Angstroms in thickness that is doped with N-type ions to a concentrating of $3E17$ $cm^{-3}$. Finally, a 500 Angstrom layer of gallium arsenide is formed on the outer surface of layer 12 and is doped with N-type ions to a concentration of $3E18$ $cm^{-3}$.

Because of the use of a single etch stop layer, the techniques and ion concentrations described previously will allow for the formation of a single recess into epitaxial layer 12 as will be discussed herein. As will be explained, in later steps, the formation of a recess into epitaxial layer 12 is used to form a high resistance and accurately controlled resistor.

If dual recess etching is desired for even greater resistance and value control, a different recipe can be used to include two etch stop layers. In this circumstance, after the second silicon pulse doping step described previously, a different process can be followed beginning with the formation of a layer of aluminum gallium arsenide approximately 220 Angstroms thick that can be doped with N-type ions to a concentration of $3E17$ cm$^-$. A first etch stop layer of aluminum arsenic or indium gallium phosphide can then be formed to a thickness on the order of 10 to 20 Angstroms. After the first etch stop layer, a layer of aluminum gallium arsenide approximately 430 Angstroms in thickness can be formed and then doped with N-type ions to a concentration of $3E17$ cm$^{-3}$. A second etch stop layer of aluminum arsenic or indium gallium phosphide can then be formed to a thickness on the order of 50 Angstroms. The structure of layer 12 can then be completed by the formation of a 550 Angstrom thick gallium arsenide layer that is doped with N-type ions to a concentration of $3E18$ cm$^{-3}$.

Using this second alternative process, two etch stop layers can be used to form a dual recess structure using two subsequent etching steps. The use of these subsequent etching steps in the formation of a high quality, high value and very accurate value integrated circuit resistor will be discussed herein.

Figure 1B:
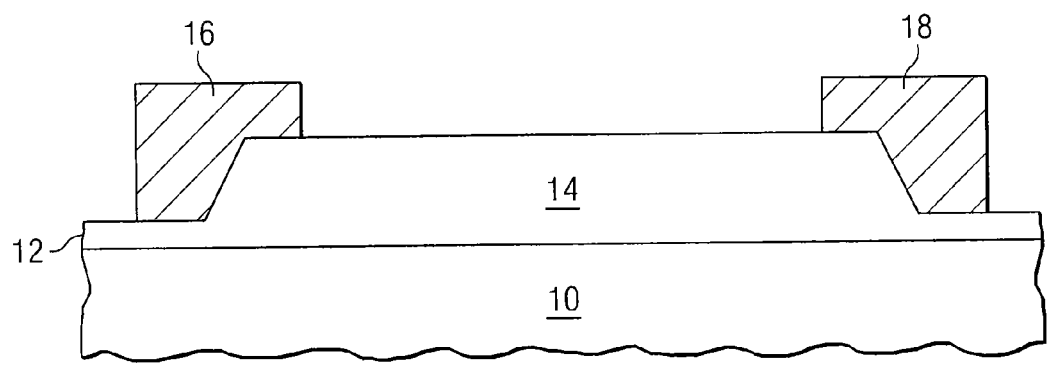

Referring to FIG. 1B, conventional photolithographic and etching techniques are used to form a mesa area 14 from layer 12. Alternatively, isolated areas of doped semiconductor can be created by reverse implanting surrounding regions. A layer of conductive material is then deposited outwardly from mesa 14 and is patterned and etched using conventional photolithographic techniques to form a first contact 16 and a second contact 18. Contact 16 and 18 may comprise a highly doped semiconductor material or a suitable metallic material such as aluminum, copper, or gold. Contacts 16 and 18 form low resistance ohmic contacts with layer 12 and particularly mesa 14.

Figure 1C:
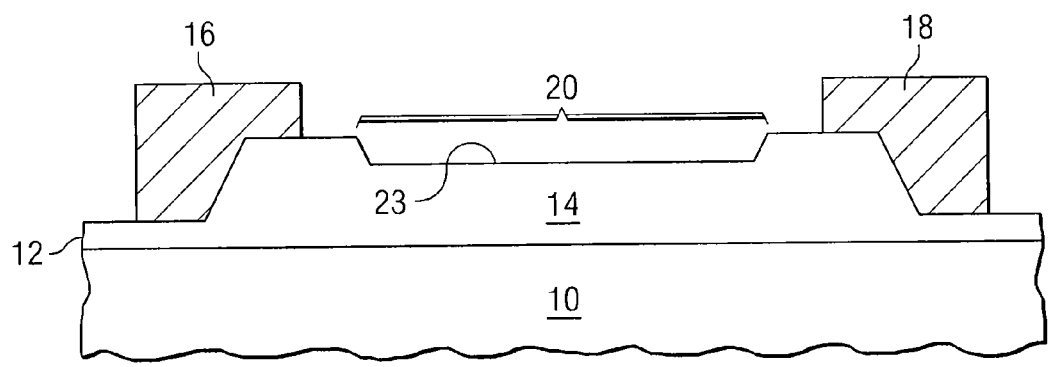

Referring to FIG. 1C, a first etch process is performed using photolithographic methods to mask all of the outer surface except for a selected area of the outer surface of mesa 14. This etch process results in the formation of a first recessed area indicated generally at 20 in FIG. 1C. Using the exemplary formation of layer 12 described previously, the formation of recess 20 would involve etching down to the most outwardly located etch stop layer described previously, indicated by reference numeral 23. This etch process may use for example, suitable active etch solutions such as hydrofluoric or hydrochloric acid. Recess 20 may be on the order of 500-550 Angstroms in depth.

Figure 1D:
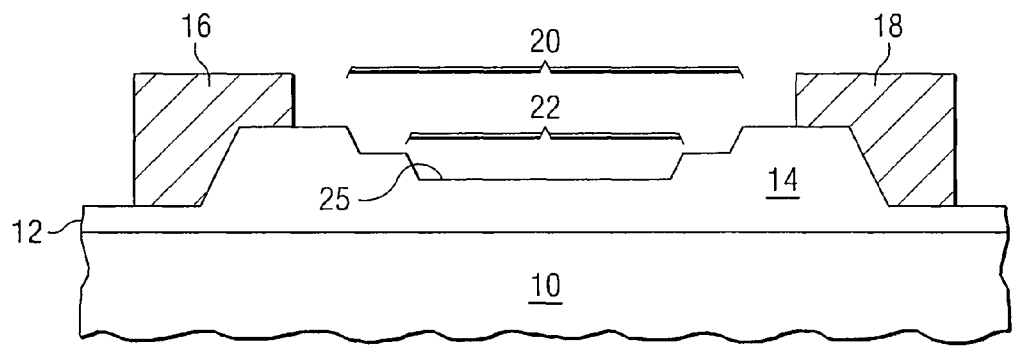

Referring to FIG. 1D, similar photolithographic processes are used to form a second recess area 22 within the first recess area 20 described previously. Second recess area 22 is approximately an additional 430-440 Angstroms in depth and may be constructed using the same chemistries and techniques as were used to construct recess 20 previously.

The conductive path between contact 16 and contact 18 passes through mesa 14. By selectively removing material through the formation of recesses 20 and 22 described previously, the electrical resistance value of the path between contact 16 and contact 18 is increased. By adjusting the size and depth of recesses 20 and 22, the overall resistance of the path between contact 16 and contact 18 can be very accurately controlled. Using the etch stop layers 23 and 25, the depth of the recesses 20 and 22 can be controlled to within a few Angstroms. The size of the recesses in the lateral dimension is easily controlled by using conventional photolithographic masks. Importantly, the exact placement of recesses 20 and 22 between contacts 16 and 18 is not as critical as the resistance value is more closely related to the amount of material removed than the exact positioning of recesses 20 and 22 within mesa 14.

Although the present invention has been described in detail with reference to particular materials that may be used to form the various layers, the present invention may also use other types of materials to achieve suitable structures. For example, devices may comprise layers of gallium arsenide, silicon, germanium, indium phosphide, gallium nitride, indium gallium phosphide, silicon carbide, aluminum gallium arsenide, silicon germanium, indium aluminum arsenide, or gallium nitride.

Although the teachings of the present invention have been described with reference to an architecture involving two etch top layers and the formation of two recess areas to adjust the resistance value, the teachings of the present invention should not be limited to this or any particular architecture. For example, etch stop layers are not required to accurately remove material from mesa 14. For example, closely timed etches or mechanical or plasma etching techniques can be used to accurately remove a particular amount of material. In addition, although the formation of two recesses is shown, any number of recesses could be used to implement particular embodiments of the present invention. For example, a single recess or more than two recesses, would work equally as well.

Figure 1E:
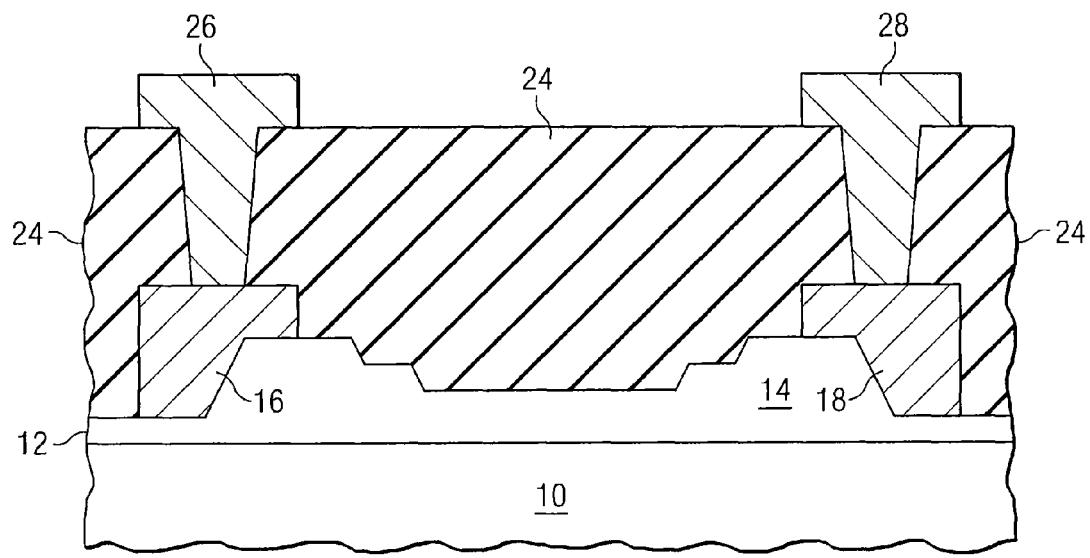

Referring to FIG. 1E, the final structure of the integrated circuit resistor constructed according to the embodiment shown is illustrated. An isolation insulator layer 24 is deposited outwardly from the contact 16 and 18 and mesa 14. Conductive contacts 26 and 28 are then formed to enable contact to contacts 16 and 18 formed previously. Isolation insulator layer 24 may comprise, for example, a suitable oxide or nitride layer. Contacts 26 and 28 may comprise for example, a suitable metallic material such as aluminum, gold, or copper.

Additionally, although the teachings of the embodiment described refers to the removal of material from an epitaxial layer only, the teachings of the present invention are not limited to this technique. For example, etching techniques that remove material through outer layers and into the primary substrate layer will also affect the resistance between the contact points. Although the present invention has been described in detail with references to the embodiment shown, it should not be construed to be limited to this or any particular embodiment, but is solely limited by the appended claims.

Further, the control of the etching processes described herein is accomplished through the use of etch stop layers. However, the teachings of the present invention are not limited to this or any technique of etching control. By way of example, and not limitation, etch processes where the depth of the etch can be controlled by careful control of the time of the etch process can also be used with suitable effectiveness.

What is claimed is:

1. An integrated circuit device, comprising:
a resistor comprising:
a semiconductor substrate comprising a first outer surface;
a semiconductor layer formed outwardly from the first outer surface and comprising a second outer surface and defining a recess in the second outer surface;
first and second contacts formed outwardly from the second outer surface and defining between the contacts the resistor, the electrical resistance of the resistor increased through the formation of the recess through the removal of one or more selective portions of the semiconductor layer; and
a first etch stop layer within the semiconductor layer, the first etch stop layer defining a first boundary between the recess and the semiconductor layer.

2. The device of claim 1, further comprising a second etch stop layer within the semiconductor layer and parallel to and spaced apart from the first etch stop layer, the second etch stop layer defining a second boundary between the recess and the semiconductor layer.

3. The device of claim 1 wherein the resistor value of the resistor is further increased by removing portions of the semiconductor substrate.

4. The device of claim 1 wherein the semiconductor substrate comprises gallium arsenide.

5. The device of claim 1 wherein the semiconductor layer comprises gallium arsenide.

* * * * *